United States Patent [19]

Gualandris et al.

[11] Patent Number: 5,045,504

[45] Date of Patent: Sep. 3, 1991

[54] DIELECTRIC LAYER OF FIRST INTERCONNECTION FOR ELECTRONIC SEMICONDUCTOR DEVICES

[75] Inventors: Fabio Gualandris, Bergamo; Luisa Masini, Milan, both of Italy

[73] Assignee: SGS-Thomson Microelectronics S.r.l., Milan, Italy

[21] Appl. No.: 385,722

[22] Filed: Jul. 26, 1989

[30] Foreign Application Priority Data

Sep. 29, 1988 [IT] Italy ............................ 22123 A/88

[51] Int. Cl.$^5$ .................................. H01L 21/033
[52] U.S. Cl. .................. 437/235; 437/231; 437/238; 437/978
[58] Field of Search ............. 437/231, 235, 978

[56] References Cited

U.S. PATENT DOCUMENTS

| | | | |
|---|---|---|---|
| 4,506,435 | 3/1985 | Pliskin et al. | 437/67 |
| 4,571,366 | 2/1986 | Thomas et al. | 437/164 |
| 4,619,839 | 10/1986 | Lehrer | 437/231 |
| 4,656,732 | 4/1987 | Teng et al. | 437/193 |
| 4,753,901 | 6/1988 | Ellsworth et al. | 437/235 |
| 4,775,550 | 10/1988 | Chu et al. | 437/231 |
| 4,806,504 | 2/1989 | Cleeves | 437/231 |

OTHER PUBLICATIONS

G. De Graaf et al., "An Investigation of Advanced First Dielectric Planarisation Techniques . . . ", V—MIC Conf. IEEE, Jun. 13-14, 1988, pp. 357-365.
S. M. Sze, *VLSI Technology*, McGraw-Hill Book Co., New York (1983), pp. 107-109.

*Primary Examiner*—Brian E. Hearn
*Assistant Examiner*—Laura M. Holtzman
*Attorney, Agent, or Firm*—Rosen, Dainow & Jacobs

[57] ABSTRACT

A dielectric layer of first interconnection for electronic semiconductor devices, specifically CMOS circuits, comprises a first thickness of tetraethylorthosilicate which is overlaid by a layer of self-planarizing siloxane. That layer provides a surface structure which is permissive of the subsequent conventional masking and electric contact attaching steps.

6 Claims, 1 Drawing Sheet

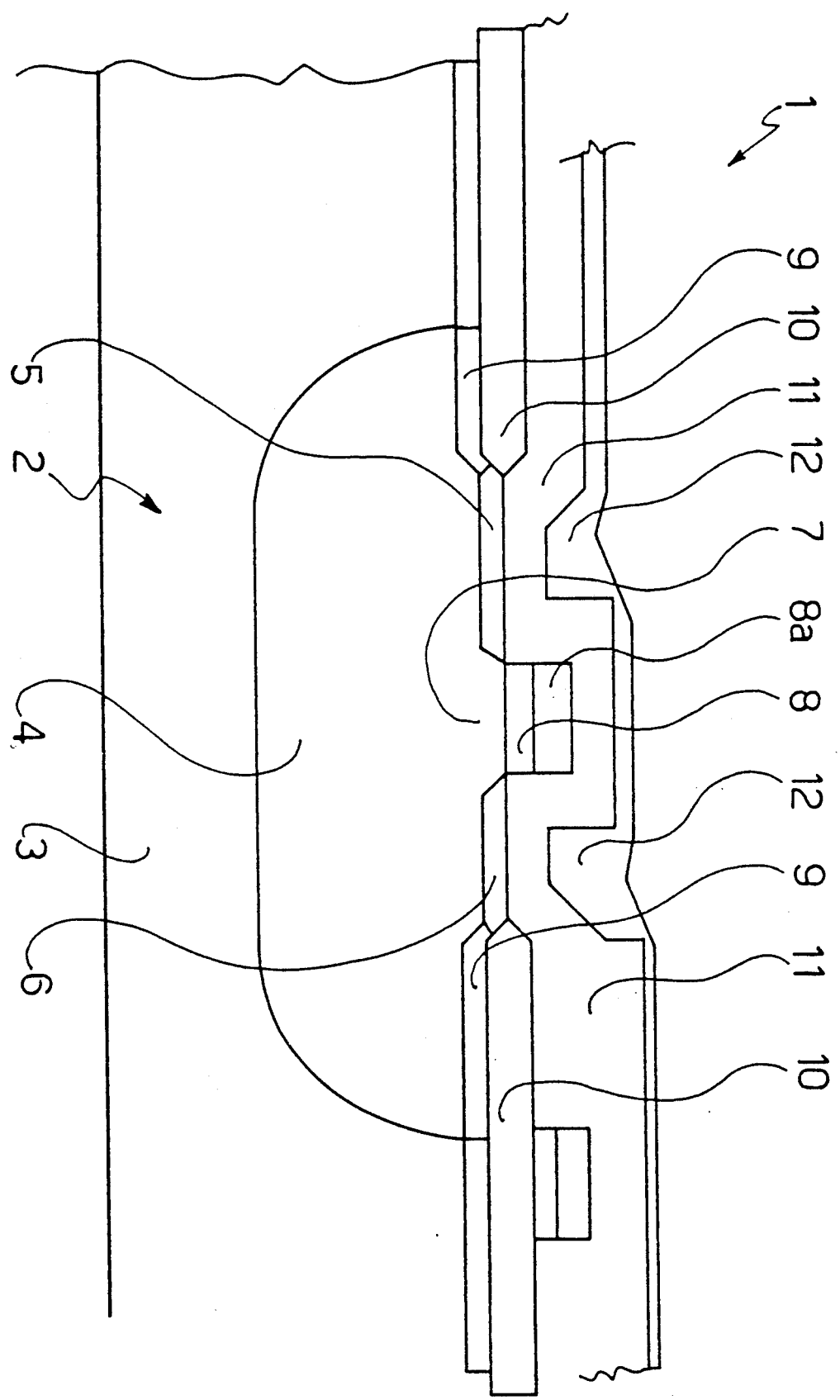

DIELECTRIC LAYER OF FIRST INTERCONNECTION FOR ELECTRONIC SEMICONDUCTOR DEVICES

DESCRIPTION

This invention relates to a dielectric layer of first interconnection for electronic semiconductor devices.

The invention is also concerned with a method of forming such a dielectric layer.

BACKGROUND OF THE INVENTION

As is known, in the course of making CMOS devices, subsequently to forming the gate and the source and drain regions of the device, and related re-oxidation, a dielectric layer of an isolating oxide is deposited to a thickness in the range of 0.8 to 1.0 micrometers.

That dielectric layer, commonly referred to as dielectric of first interconnection, separates the surface layer of polycrystalline silicon from the metallic paths of electrical interconnection.

Once the gate of the device has been defined, the device shows a predetermined map.

The successive deposition of the dielectric layer of first interconnection follows this map enhancing, however, its features affect the subsequent masking, contact forming, and metal deposition steps result in a low yield of current manufacturing processes due to high rate of faulty devices. In addition, surface irregularities on the mapping represent a major hindrance to a reduction in size of the interconnection paths to the metallization mask.

To obviate this drawback, the prior art has proposed, for CMOS devices, the use of a double dielectric layer formed of a first thickness of silicon dioxide over which a layer of borophosphosilicate is deposited.

Borophosphosilicate (i.e. borophosphosilicate glass or BPSG) allows the underlying map to be softened if the semiconductor is subjected to heat treatment at 900°–1,000° C. for about 30–60 minutes.

In accordance with a method known as classic planarization, for example as described in the "5th International IEEE V-Mic Conference" No. 357, June 13–14, 1988, the borophosphosilicate is coated with a photoresist layer and plasma attacked with selectivity 1a1. A fairly planar surface is thus obtained; however, the reproducibility of this process is poor and the process itself non-uniform, which is inconsistent with the requirements of of very large volume integrated circuit manufacturing processes. Also, the extent of the planarization to be achieved thereby is heavily dependent on the underlying mapping, and in addition, two extra steps have in all cases to be provided in the manufacturing process.

A second prior technique, as described for example in the "5th International IEEE V-Mic Conference", No. 293, June 13–14, 1988, consists of superimposing, on the borophosphosilicate, a layer of siloxane, or so-called spin-on-glass (SOG), which shows to be less sensitive to the underlying mapping during the selective attack step. However, here too does the manufacturing process involve extra steps.

A further prior approach is described in the "4th International IEEE V-Mic Conference", No. 61, June 15–16, 1987, and consists of depositing the siloxane directly onto the map surface, and hence on the layer of polycrystalline silicon, and of applying a heat treatment under a nitrogen medium followed by deposition of a borophosphosilicate layer. Further final heat treatment at 920° C. is found to soften the profile contour of the end surface. However, not even this approach has proved quite effective to yield planarized structures, despite any advantages to be derived therefrom.

SUMMARY OF INVENTION

The technical problem underlying this invention is to provide a novel type of dielectric of first interconnection which has such characteristics as to make it self-planarizing.

This problem is solved by a dielectric layer of first interconnection being characterized in that it comprises a first thickness of tetraethylorthosilicate on which a layer of self-planarizing siloxane is superimposed.

SUMMARY OF DRAWINGS

The features and advantages of a dielectric layer according to the invention will be apparent from the following detailed description of an embodiment thereof, to be taken by way of illustration and not of limitation in conjunction with the accompanying drawing.

The drawing shows schematically a side elevation cross-sectional view of the structure of an electronic semiconductor device incorporating a dielectric layer of first interconnection in according to the invention.

DETAILED DESCRIPTION OF PREFERRED EMBODIMENT

With reference to the drawing view, generally and schematically shown at 1 is an electronic semiconductor device, specifically a CMOS device, comprising a P-channel MOS transistor 2 and an N-channel MOS transistor serially connected to each other.

The device 1 comprises a semiconductor substrate 3 which is very slightly doped with impurities of the P type and in which a pod 4, commonly referred to as an N-well, is formed which is doped oppositely from the substrate.

Inside the N-well pod 4 there are formed two zones 5 and 6, both doped P-type, which are adapted to form the source and drain of the transistor 2 as well as to bound a so-called channel region 7 overlaid by a layer 8 of an isolating oxide, the so-called gate oxide, with a gate 8a of polycrystalline silicon.

At the peripheral margins of the N-well pod 4, laterally of the source 5 and drain 6 zones, there are provided opposing isolating zones 9 overlaid by a layer 10 of silicon oxide, the so-called field oxide.

Beginning with this configuration, a layer or thickness 11 of tetraethylorthosilicate is deposited on the device 1 using an LPCVD reactor at a temperature in the 700°–750° C. to form silicon oxide range.

With this technique, it becomes possible to obtain a high covering degree such that the difference between the thickness 11 of this oxide over the gate 8a and the source 5 and drain 6 amounts to less than 10%.

Subsequent heat treatment at 900° C. under a nitrogen medium for about 10 minutes imparts the layer 11 of tetraethylorthosilicate with excellent electrical properties while retaining its covering capability unaltered.

Preferably, the thickness of the layer 11 is only by 500 Å smaller than the thickness of the polycrystalline silicon of the gate 8a.

Advantageously, the layer 11 is overlaid by a layer 12 of self-planarizing siloxane. That layer is formed by using a dispenser, known as spinner, whereby the siloxane is dispensed as diluted in alcohol which is then subjected to heat treatment for conversion into a dielectric.

More specifically, the siloxane layer 12 is placed in contact with a heated plate to 200° C. for 1 minute. Thereafter, it is subjected to a first heat treatment step at 425° C. under a nitrogen atmosphere at a pressure of 100 mTorr for 60 minutes, and for a like time period, to a second heat treatment step at a temperature of 600° C.

Additional treatment at 900° C. under a steam medium at atmospheric pressure for 30 minutes will complete the process required to convert the diluted siloxane into a dielectric material.

The end product of the process just described is a planar structure which can then be passed to conventional masking, contact masking, contact attachment, resist removal, interconnection material and final passivation oxide layer deposition steps.

It is advisable that the electrical interconnection be made using a first layer of titanium to prevent so-called electric poisoning from the siloxane. Laboratory tests have revealed, moreover, excellent adhesion of the final passivation dielectric layers to the siloxane.

The dielectric layer of first interconnection according to the invention affords a high degree of planarity on many types of semiconductor devices.

Another advantage is that this dielectric layer can improve the output of the contact and metallization layer lithography process and increase the lithographic resolution of metallization while favoring more compact interconnection structures.

A further advantage is that this dielectric layer enables the interconnection structures to be designed independently of the substrate mapping, and facilitate automated designing.

We claim:

1. A method of making a dielectric layer of first interconnection for an electronic semiconductor device, characterized in that it comprises a step of deposition of a first layer of tetraethylorthosilicate to form silicon oxide followed by a step of deposition of a layer of self-planarizing siloxane, subsequent to the siloxane deposition step, at least one heat treatment step of predetermined duration is carried out at a predetermined temperature under a low-pressure nitrogen atmosphere, and following the heat treatment step in nitrogen, the device is subjected to a further final heat treatment step carried out under a stream medium at atmospheric pressure for a predetermined time duration.

2. A method according to claim 1, wherein between said steps of deposition of the tetraethylorthosilicate and the siloxane, the device is subjected to a heat treatment under a nitrogen atmosphere for a predetermined time duration.

3. The method of claim 1, wherein the device comprises a CMOS semiconductor device having active source and drain regions, a patterned oxide layer comprising a field oxide, a gate oxide, a polysilicon gate layer, and a patterned conductive layer of metal over the dielectric layer of first interconnection.

4. The method of claim 3, wherein the metal comprises titanium.

5. The method of claim 1, wherein the first interconnection dielectric layer has a thickness in the range of 0.8–1.0 microns.

6. The method of claim 5, wherein the device comprises a polysilicon gate layer under the first layer, and the first layer has a thickness about 500 Å smaller than that of the polysilicon layer.

* * * * *